United States Patent
Sun et al.

(10) Patent No.: US 6,511,891 B2
(45) Date of Patent: Jan. 28, 2003

(54) METHOD OF PREVENTING TOPPLING OF LOWER ELECTRODE THROUGH FLUSH CLEANING

(75) Inventors: Nathna Sun, Taipei (TW); Benjamin Szu-Min Lin, Hsinchu (TW); Chuan-Fu Wang, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 30 days.

(21) Appl. No.: 09/882,747

(22) Filed: Jun. 14, 2001

(65) Prior Publication Data

US 2002/0192923 A1 Dec. 19, 2002

(51) Int. Cl.$^7$ .................................................. H01L 21/20
(52) U.S. Cl. ........................................ 438/396; 257/303
(58) Field of Search ............................... 257/303, 309; 438/396, 397, 398

(56) References Cited

U.S. PATENT DOCUMENTS 6,184,078 B1 * 2/2001 Yoon et al. ................. 438/253

FOREIGN PATENT DOCUMENTS

| JP | 40-3025971 | * | 2/1991 | ......... H01L/27/108 |
| JP | 2000-021613 | * | 6/1998 | ........... H01L/17/06 |

* cited by examiner

*Primary Examiner*—Carl Whitehead, Jr.
*Assistant Examiner*—Pamela E Perkins
(74) *Attorney, Agent, or Firm*—Charles C. H. Wu; Wu & Cheung, LLP

(57) ABSTRACT

A method of forming the lower electrode of a capacitor capable of withstanding the flushing force produced by a cleaning agent. A lower electrode having a rectangular profile when viewed from the top is provided. The lower electrode is bounded by a pair of ends and a pair of sides. The ends and the sides are linked together. The ends have a wedge shape. The sides have edges that cave in towards the center, thereby forming a recess region between the sides. A flushing operation is carried out using a cleaning solution. The cleaning solution flows from one end of the electrode to the other end along the sides.

9 Claims, 3 Drawing Sheets

METHOD OF PREVENTING TOPPLING OF LOWER ELECTRODE THROUGH FLUSH CLEANING

BACKGROUND OF THE INVENTION

1. Field of Invention

The present invention relates to a semiconductor structure. More particularly, the present invention relates to the lower electrode structure of a capacitor that can withstand the flushing force produced by a cleaning agent.

2. Description of Related Art

Capacitor is the data storage section of a dynamic random access memory (DRAM). Data value of each memory cell is recorded as the amount of charges carried by the capacitor. Due to the miniaturization of memory cells, each cell is very small. To increase the capacitance of a capacitor and to reduce data errors and the number of memory refreshes, height of the lower electrode is frequently raised to increase the effective surface area of a capacitor.

FIG. 1 is a schematic cross-sectional view of the lower electrode of a conventional capacitor. To fabricate a conventional capacitor, a plurality of metal-oxide-semiconductor MOS transistors is formed over a substrate 100. Each MOS transistor includes a gate electrode 102 above the substrate 100, spacers 104 on the sidewalls of the gate electrode 102 and source/drain regions 106 in the substrate 100 on each side of the gate electrode 102. A dielectric layer 108 is formed over the substrate 100 covering the MOS transistor. A bit line 110 is formed in the dielectric layer 108. The bit line 110 is electrically connected to one of the source/drain terminals 106. Another dielectric layer 112 is formed over the substrate 100 covering the bit line 110. A plurality of lower electrodes 114 that pass through the dielectric layers 108 and 112 is formed with each lower electrode 114 electrically connected to a source/drain terminal 106.

FIG. 2 is a top view showing a plurality of conventional capacitor lower electrodes on a substrate. As shown in FIG. 2, a conventional lower electrode 114 has a rectangular shape. Before carrying out other processing treatment such as the growth of hemispherical silicon grains over the electrode for increasing effective surface area or the deposition of a capacitor dielectric layer, RCA cleaning solution is used to clean the surface. The RCA solution contains de-ionized water, sulfuric acid ($H_2SO_4$) and hydrogen peroxide ($H_2O_2$). The cleaning process includes repeated flushing of the lower electrodes 114 with de-ionized water, sulfuric acid solution and hydrogen peroxide solution.

However, as size of each memory cell is reduced, height of the capacitor lower electrode 114 must increase correspondingly to compensate for the shrinkage in surface area so that sufficient charge storage capacity is still present. Yet, the increase in height makes the lower electrode 114 more vulnerable to tearing when RCA solution is used to clean the surface. FIG. 3 is a top view showing the array of capacitor lower electrodes-after flushing with a cleaning solution. As shown in FIG. 3, a few of the lower electrodes 114 are flushed away from their original positions into new positions 114a. Due to the flushing damages, production yield of the process is lowered.

SUMMARY OF THE INVENTION

Accordingly, one object of the present invention is to provide a method of forming the lower electrode of a capacitor capable of withstanding the flushing force produced by a cleaning agent. A lower electrode having a rectangular profile when viewed from the top is provided. The lower electrode is bounded by a pair of ends and a pair of sides. The ends and the sides are linked together. The ends have a wedge shape. The sides have edges that cave in towards the center, thereby forming a recess region between the sides. A flushing operation is carried out using a cleaning solution. The cleaning solution flows from one end of the electrode to the other end along the sides.

This invention also provides an alternative method of forming the lower electrode of a capacitor capable of withstanding the flushing force produced by a cleaning agent. The lower electrode is a rectangular prism and has an hourglass shape when viewed from the top. The two sides of the lower electrode are edges that cave in towards the center. A recess region is defined between the two sides. A flushing operation is carried out using a cleaning solution. The cleaning solution flows from one end of the lower electrode to the other along the two sides of the lower electrode.

The step of flushing the lower electrodes can be carried out before other processing treatment such as the growth of hemispherical silicon grains over the electrode for increasing effective surface area or the deposition of a capacitor dielectric layer. The cleaning process includes repeated flushing of the lower electrodes with solutions such as de-ionized water, sulfuric acid solution and hydrogen peroxide solution.

The capacitor lower electrode structure of this invention has an hourglass profile and hence a more streamline body. According to fluid dynamics, resistant towards fluid motion is smaller. Consequently, the cleaning solution rushing past the lower electrode will cause less shearing and hence will result in the least damage. Furthermore, surface area of the lower electrode is also more than a conventional lower electrode, thereby increasing capacitance of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
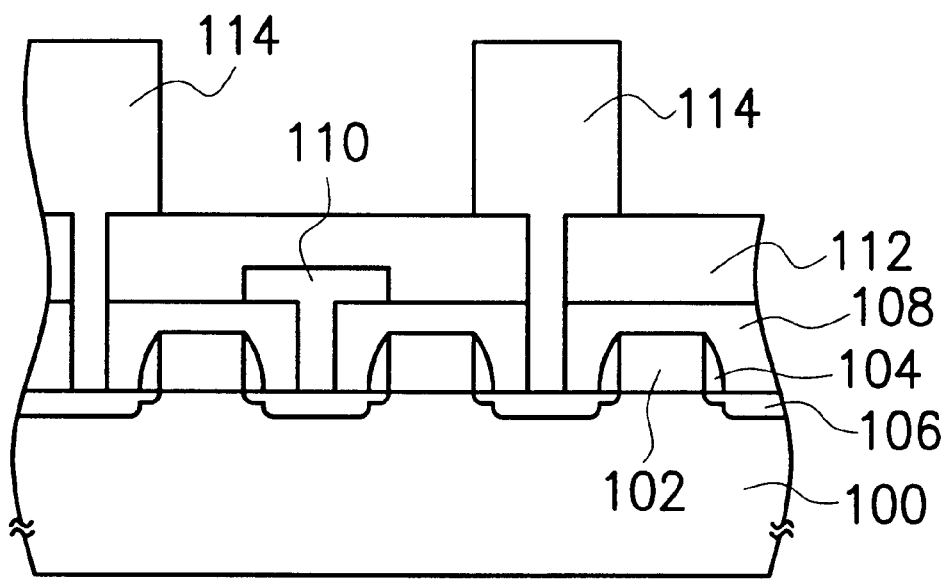
FIG. 1 is a schematic cross-sectional view of the lower electrode of a conventional capacitor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
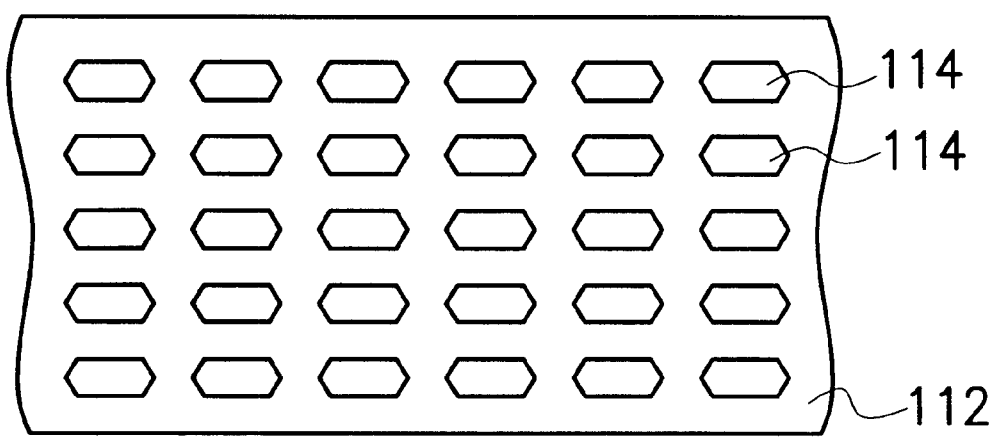
FIG. 2 is a top view showing a plurality of conventional capacitor lower electrodes on a substrate.
Figure 3:
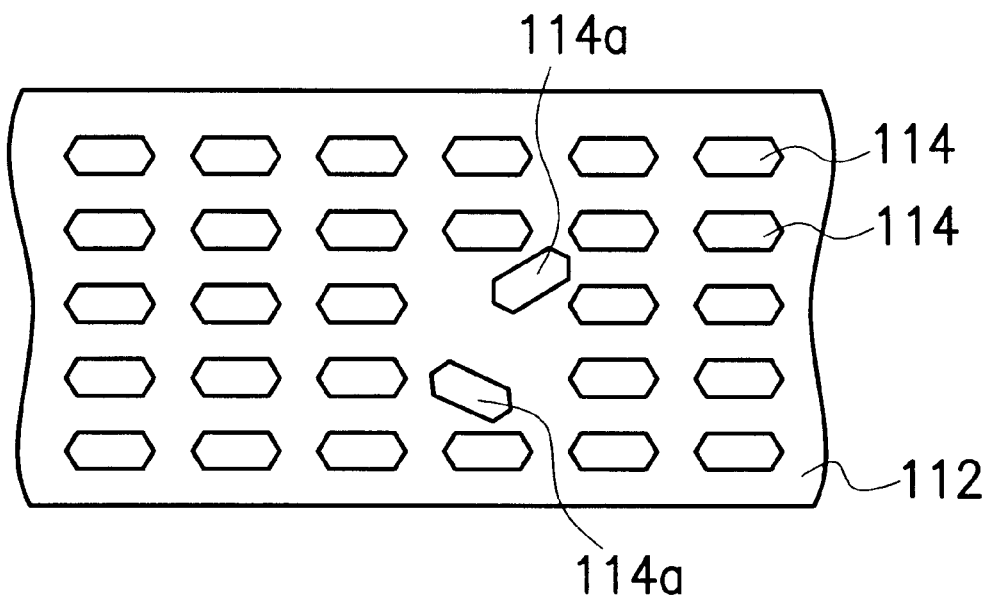
FIG. 3 is a top view showing the array of capacitor lower electrodes after flushing with a cleaning solution.
Figure 4:
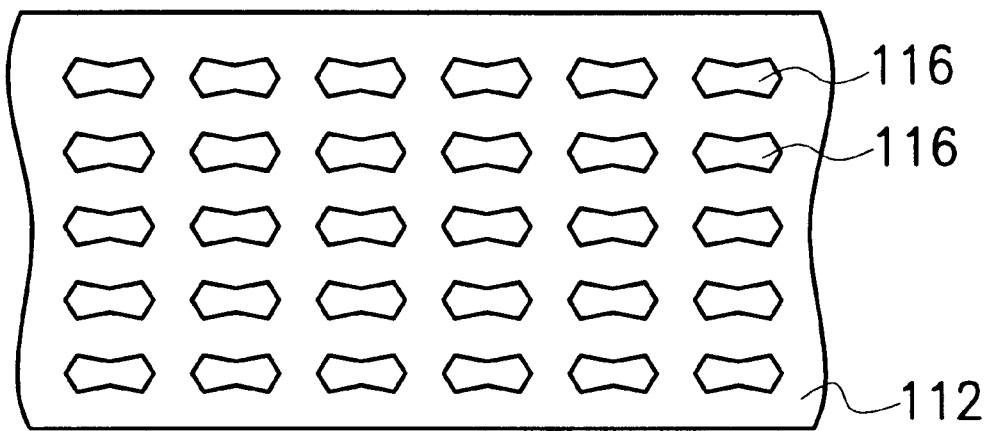
FIG. 4 is a top view showing an array of capacitor lower electrodes according to one preferred embodiment of this invention.
Figure 5:
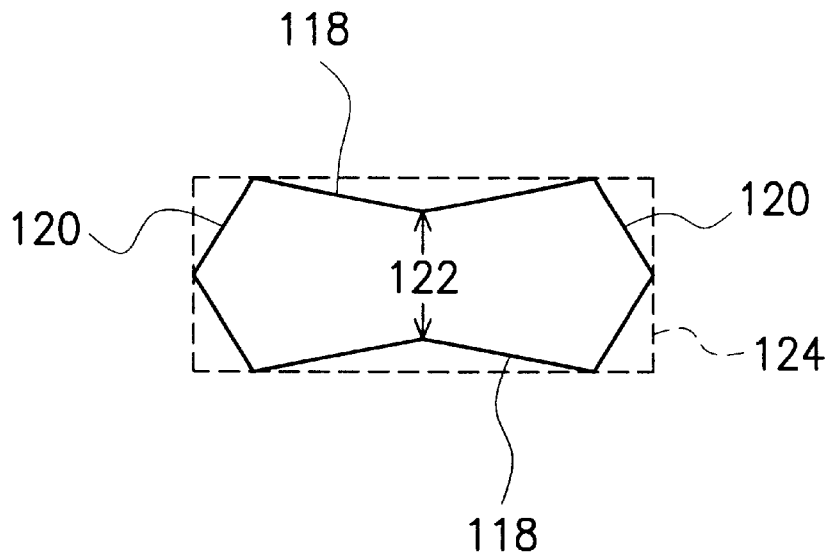
FIG. 5 is a top view showing a capacitor lower electrode according to one preferred embodiment of this invention.

FIG. 4 is a top view showing an array of capacitor lower electrodes according to one preferred embodiment of this invention. As shown in FIG. 4, this invention provides a special type of lower electrode structure 116 for a capacitor. The capacitor lower electrode 116 is a rectangular prism having a side profile similar to the one shown in FIG. 1. Since the positioning of the array of lower electrodes is similar to a conventional arrangement, detailed description is not repeated here. FIG. 5 is a top view showing a capacitor lower electrode according to one preferred embodiment of this invention. Aside from a difference in shape for the lower electrode, other aspects are the same. Hence, the labels in FIGS. 1 to 3 are reused.

As shown in FIG. 5, the electrode has a rectangular outline 124 very similar to an hourglass viewed from the top. The lower electrode 124 is bounded by a pair of sides 118 and a pair of ends 120. The sides 118 and the ends 120 are linked together. The sides 118 are edges that cave in towards the center, thereby forming an hourglass profile. A recess region 122 is defined between the sides 118. The ends of the lower electrode 124 can have a wedge shape. The lower electrode 116 can be made using polysilicon, for example.

Figure 6:
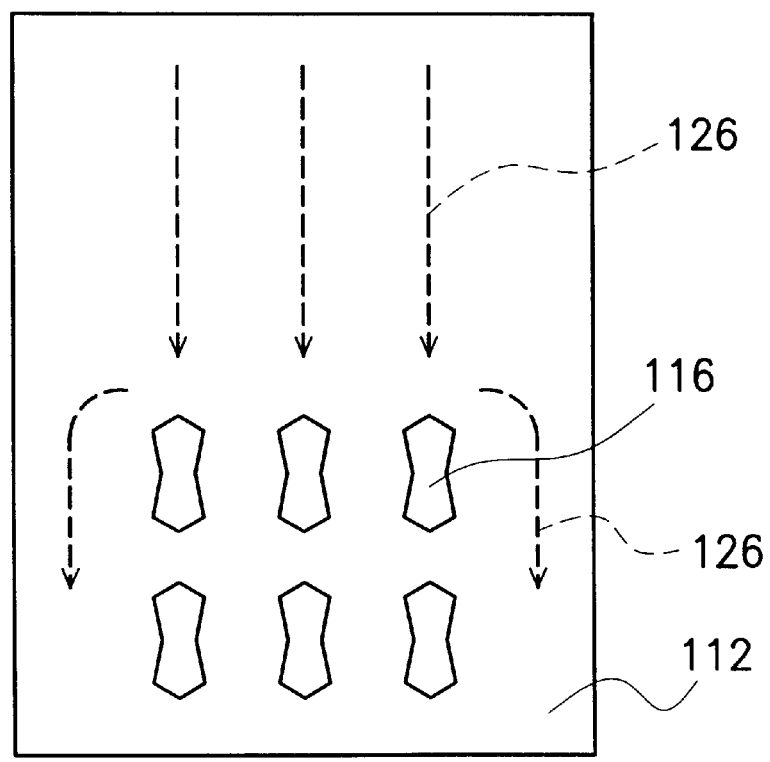
FIG. 6 is a diagram from the top outlining fluid motion paths when a cleaning solution is used to flush the capacitor lower electrodes of this invention.

FIG. 6 is a diagram from the top outlining fluid motion paths when a cleaning solution is used to flush the capacitor lower electrodes of this invention. Before carrying out other processing treatment such as the growth of hemispherical silicon grains over the electrodes 116 for increasing effective surface area or the deposition of a capacitor dielectric layer, the surface having the electrodes thereon must be cleaned. As shown in FIG. 6, the substrate 100 is positioned at a definite angle with respect to the horizontal. The surface of with electrodes 116 is flushed using a cleaning solution 126. The cleaning solution 126 flows from one end 120 of the electrode 116 to the other end 120 along the sides 118. For example, a RCA cleaning solution may be used to clean the electrode surface. The RCA solution contains de-ionized water, sulfuric acid and hydrogen peroxide. Alternatively, the lower electrodes 116 are repeated flushed by deionized water, sulfuric acid solution and hydrogen peroxide solution.

The capacitor lower electrode structure 116 of this invention has a more streamline body. According to fluid dynamics, resistant towards fluid motion is smaller. Consequently, the RCA cleaning solution rushing past the lower electrode will cause less shearing and hence will result in the less damage. Furthermore, surface area of the lower electrode is also more than a conventional lower electrode, thereby increasing capacitance of the capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of shaping the lower electrode of a capacitor for minimizing shearing damage during surface flushing, comprising the steps of:

providing a lower electrode in the form of a rectangular prism and a rectangular shape viewed from the top, wherein the rectangular shape is bounded by a pair of ends and a pair of sides, the ends and sides are linked together and the sides has edges that cave in towards the center, and a recess region is defined between the respective sides; and flushing the lower electrode with a cleaning solution in such a way that the cleaning solution moves from one end of the electrode to the other end along the sides.

2. The method of claim 1, wherein material constituting the lower electrode includes polysilicon.

3. The method of claim 1, wherein the ends have a wedge shape.

4. The method of claim 1, wherein the step of flushing the lower electrode includes cleaning the surface of the lower electrode.

5. The method of claim 4, wherein the step of cleaning the surface of the lower electrode includes flushing the lower electrode repeatedly with de-ionized water, sulfuric acid solution and hydrogen peroxide.

6. A method of shaping the lower electrode of a capacitor for minimizing shearing damage during surface flushing, comprising the steps of:

providing a lower electrode having an hourglass profile when viewed from the top, wherein the lower electrode has a pair of sides with edges that cave in towards the center, and a recess region is defined between the respective sides; and flushing the lower electrode with a cleaning solution in such a way that the cleaning solution runs along the sides of the electrode.

7. The method of claim 6, wherein material constituting the lower electrode includes polysilicon.

8. The method of claim 6, wherein the step of flushing the lower electrode includes cleaning the surface of the lower electrode.

9. The method of claim 8, wherein the step of cleaning the surface of the lower electrode includes flushing the lower electrode repeatedly with de-ionized water, sulfuric acid solution and hydrogen peroxide.

* * * * *